(12) United States Patent
Wang

(10) Patent No.: US 7,846,751 B2
(45) Date of Patent: Dec. 7, 2010

(54) LED CHIP THERMAL MANAGEMENT AND FABRICATION METHODS

(76) Inventor: Wang Nang Wang, Marlets, Midford Lane, Limpley Stoke, Bath BA2 7GW (GB)

(*) Notice: Subject to any disclaimer, the term of this patent is extended or adjusted under 35 U.S.C. 154(b) by 138 days.

(21) Appl. No.: 11/942,109

(22) Filed: Nov. 19, 2007

(65) Prior Publication Data

US 2009/0127567 A1 May 21, 2009

(51) Int. Cl.
*H01L 21/00* (2006.01)
*H01L 29/26* (2006.01)
*H01L 33/00* (2006.01)

(52) U.S. Cl. .................. 438/22; 438/24; 257/79; 257/80; 257/E33.001

(58) Field of Classification Search ............ 438/22, 438/24; 257/79, 80, E33.001
See application file for complete search history.

(56) References Cited

U.S. PATENT DOCUMENTS

| | | | |
|---|---|---|---|
| 5,650,592 A * | 7/1997 | Cheskis et al. ............. 174/540 |
| 6,642,652 B2 | 11/2003 | Collins, III et al. | |
| 6,658,041 B2 | 12/2003 | Uebbing | |
| 6,734,466 B2 | 5/2004 | Chua | |
| 6,744,071 B2 | 6/2004 | Sano et al. | |
| 6,744,196 B1 | 6/2004 | Jeon | |
| 6,770,542 B2 | 8/2004 | Plossl et al. | |
| 6,800,500 B2 * | 10/2004 | Coman et al. .............. 438/22 |
| 7,195,944 B2 * | 3/2007 | Tran et al. ................. 438/46 |
| 7,282,265 B2 * | 10/2007 | Fukushima ................ 428/408 |
| 2004/0135158 A1 | 7/2004 | Hon | |
| 2004/0235210 A1 | 11/2004 | Tamura et al. | |
| 2004/0245543 A1 | 12/2004 | Yoo | |
| 2006/0091409 A1 | 5/2006 | Epler et al. | |

OTHER PUBLICATIONS

Roos et al., "Is the Electrolytic Codeposition of Solid Particles a Reliable Coating Technology?", Proceedings of the 71st Annual Technical Conference of the American Electroplaters Society, Paper 0-1, 1984, pp. 1-12.
Greco et al., "Electrodeposition of Ni-Al2-O3, Ni-TiO2 and Cr-TiO2 Dispersion Hardened Alloys", Plating, 1968, vol. 55, pp. 250-257.
Roos, "A New Generation of Electrolytic and Electroless Composite Coatings", Proceedings Incef86, Bangalore, 1988, pp. 382-391.

* cited by examiner

*Primary Examiner*—Luan C Thai
(74) *Attorney, Agent, or Firm*—Kauth, Pomeroy, Peck & Bailey LLP

(57) ABSTRACT

The present invention relates to a method of fabricating a high power light-emitting device using an electrolessly or electrolytically plated metal composite heat dissipation substrate having a high thermal conductivity and a thermal expansion coefficient matching with the device.

18 Claims, 5 Drawing Sheets

LED CHIP THERMAL MANAGEMENT AND FABRICATION METHODS

FIELD OF THE INVENTION

The present invention generally relates to a light-emitting device and a method for fabricating the same.

BACKGROUND OF THE INVENTION

Recent advances in the field of compound semiconductors have given rise to a new generation of light-emitting diodes (LEDs) and lasers for the visible spectral range, particularly in the III-V nitrides-based blue and green wavelength regions. The main advantage of nitride semiconductors in comparison with other wide band-gap semiconductors is their low degradation in optical devices under high current density driving. In recent years, enormous efforts have been made by companies to enter into new house lighting and LCD back-lighting markets. The general idea is to replace conventional incandescent or fluorescent lamps by more reliable and compact semiconductor light sources, namely LED lamps. LED-based white appearance lighting aimed at replacing conventional incandescent or fluorescent lamps can be produced by a few methods such as using phosphors for down-conversion of blue or UV LEDs, and using a combination of different wavelength LEDs (such as red, green, and blue LEDs).

One of the key obstacles for market penetration is the lumens/$ cost of lamps based on LEDs. One of the common approaches is to drive an LED with the highest current density possible with minimum efficiency droop. Epitaxial growth of the LED structure to fine-tune multiple quantum wells and diffusion barriers can partially improve this efficiency droop, but good thermal management in the chip packaging to reduce the junction temperature is very critical to obtain nearly zero efficiency droop devices.

Various approaches of attaching high thermal conductivity materials onto LEDs have been adopted. Chemical vapour deposited diamond (CVD diamond), silicon carbide (SiC), aluminium nitride (AlN), and boron nitride (BN) are commonly used non-metal type sub-mounts to dissipate heat from LEDs. Copper (Cu), aluminium (Al), nickel (Ni), and CuW alloy are commonly used metal and metal alloy sub-mounts for LEDs. However, although such metal and metal alloys provide very good thermal management for LEDs, the thermal expansion coefficient (CTE) mismatch becomes an issue for device reliability after long thermal cycles of operation under high current density. CVD diamond provides excellent thermal management for LEDs, but with less satisfactory CTE matching with LEDs. Other non-metal materials such as AlN provide better thermal expansion coefficient matching, but less satisfactory thermal management.

Accordingly a need exists for LEDs and method of manufacturing LEDs having improved thermal properties.

SUMMARY OF THE INVENTION

The present invention relates to a method of fabricating a high power light-emitting device preferably using an electrolessly or electrolytically plated metal composite heat dissipation substrate of high thermal conductivity and excellent thermal expansion coefficient matching with the device.

In one embodiment of the fabrication method the metal composite can be formed on reflector and contact layers by electroless or electrolytic plating. In such an embodiment the reflector and contact layers on p-type or n-type compound semiconductors can be deposited using various techniques such as sputtering, e-beam evaporation, or electroless or electrolytic plating.

In another embodiment of the fabrication method, the device structure can be grown by MOCVD (Metal organic chemical vapour deposition), HVPE (Hydride vapour phase epitaxy), or MBE (Molecular beam epitaxy).

In still another embodiment of the fabrication method, a sapphire, silicon carbide, LiAlO2, ZnO or silicon substrate can be removed using laser lift-off (LLO), selective wet etching, photo-electrochemical etching, electrochemical etching, or chemical mechanical polishing.

In yet another embodiment of the fabrication method, the thermal expansion of the metal composite can be tuned by using one or more different types of particle materials, different particle size distributions and different volume percentages of particles in the metal composite.

In still yet another embodiment of the LED of the current invention, the roughened surface of LED wafers and chips for enhanced light extraction can be readily leveled with electroless or electrolytic plating processes.

In still yet another embodiment of the LED of the current invention, the cost of wafer bonding can be reduced by eliminating the complex and lengthy wafer bonding/gluing process of LED devices on to a different sub-mount for better thermal management.

In still yet another embodiment of the LED of the current invention, the reliability of an LED device is improved due to the better match of the CTE between the substrate and the device material.

BRIEF DESCRIPTION OF THE DRAWINGS

These and other features and advantages of the present invention will be better understood by reference to the following detailed description when considered in conjunction with the accompanying drawings wherein.

DETAILED DESCRIPTION OF THE INVENTION

Figure 1:
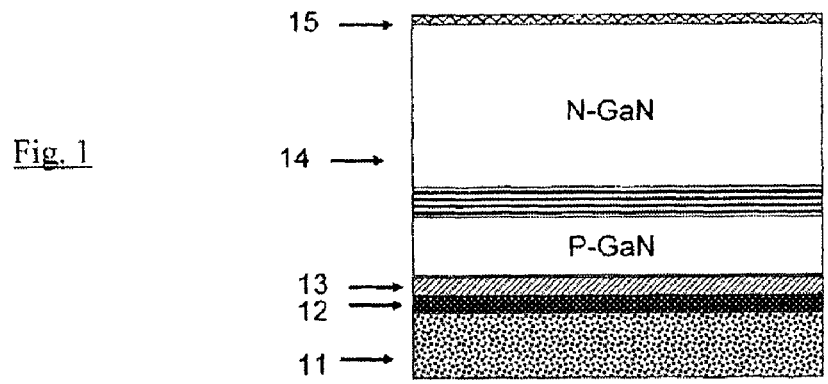
FIG. 1 shows a first embodiment of a vertical LED in accordance with the invention.

To illustrate the present invention, various practical examples and the accompanying drawings using techniques in accordance with the invention are described below:

FIG. 1 shows an exemplary structure of an embodiment of a vertical LED device with a foreign substrate removed. The LED device includes an LED wafer or chip 14, a p-contact metal layer 13, a mirror or reflector layer 12, an electrolytically plated metal composite substrate 11 and an n-metal contact layer 15. A p-type bonding pad can be connected directly to the metal composite substrate 11, and an n-type bonding pad can be deposited onto the n-metal contact layer and connected by any suitable means.

Figure 2A:
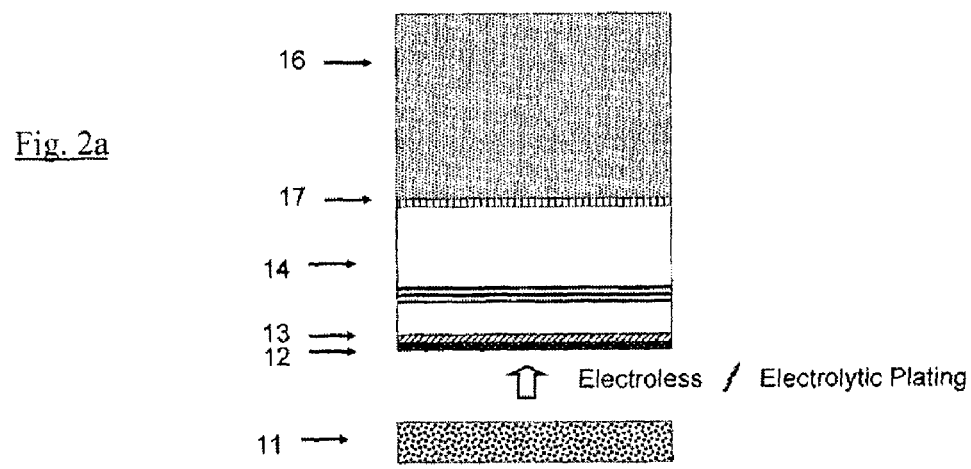
FIGS. 2a)-2c) show schematically fabrication process steps of the LED with a metal composite substrate.
Figure 2B:
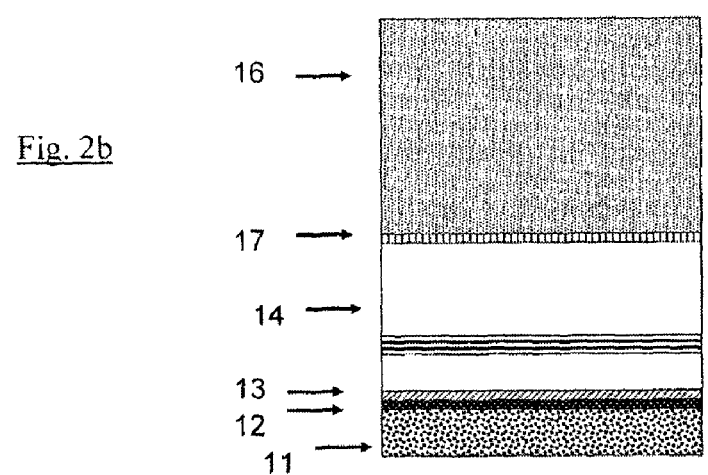
Figure 2C:
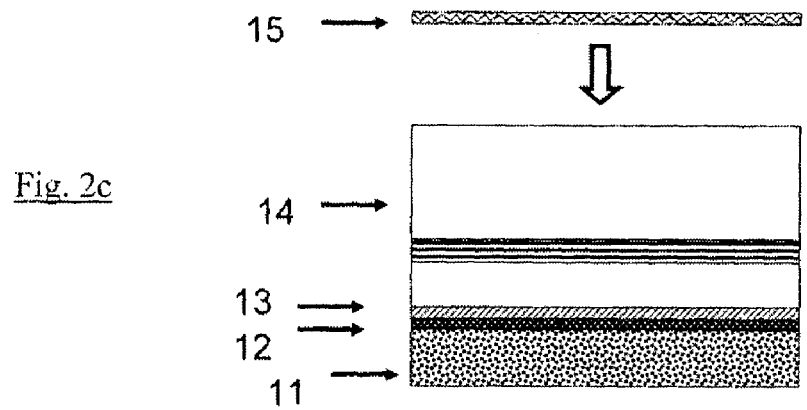

FIGS. 2a-2c show schematically fabrication process steps to produce such an LED device with a metal composite substrate. An LED epitaxial structure 14 is grown on a foreign substrate 16 by MOCVD, HVPE or MBE. The metal contact layer 13 on the p-type III-V nitride semiconductor of structure 14 can be deposited using e-beam evaporation, sputtering (RF, DC or AC), electroless or electrolytic plating, chemical vapour deposition, plasma enhanced chemical vapour deposition (PECVD), atomic layer deposition (ALD), physical vapour deposition, evaporation, plasma spraying or spin coating, or a combination of these techniques. The metal contact layer 13 can be single or multi-layered with good optical transparency. Examples of the p-type metal contact layer include, for example, Ni/Au, Pt/Au, Pd/Au, Ni/ZnO, Ni/Au/ITO, single walled carbon nanotubes, Pt and Pd. The mirror layer 12 is then deposited by the methods used for depositing the metal contact layer. The mirror layer includes a reflector layer comprising, for example, Ag, Al, Cr, Pt or Ti and a buffer layer such as Au, Ni, Ni/Au, TiN, Ti/Au, Cr/Au, W or Ni/Cr/Au. Then electroless or electrolytic plating of metal composite 11 using solutions containing metals such as Cu and Ni with suspended particles of CVD diamond, AlN or BN is formed onto the mirror layer 12. The carrier substrate 16 is then removed using laser ablation, etching, grinding/lapping or chemical mechanical polishing or wet etching, among others. An n-type contact layer 15 with good optical transparency is then deposited on to the n-type III-V nitride semiconductor of structure 14. Examples of the n-type metal contact layer include Ti/Al, ZnO, ITO, TiN, Ni/ZnO and Ni/Au/ITO.

The epitaxial growth of LED structure 14 includes a sacrificial layer 17 between the substrate and the top device structure. The sacrificial layer 17 can be prepared by different methods. One example is to grow a layer of porous metal nitride such as titanium nitride or chromium nitride for easy mechanical separation. A second example is to grow low temperature aluminum nitride for easy chemical wet etching. A third example is to grow a high UV optical absorption InGaN layer to facilitate laser lift-off separation. A fourth example is to fabricate or grow nanostructures in the interface of the LED structure and the substrate to facilitate separation using mechanical, electrochemical or chemical wet etching methods.

The nanostructures can be nano-columns (also called nano-wires, nano-pillars or nano-posts), nano-pores or nano-networks. The shapes of such nano-pores can be any random or well defined arrangement of square, circular, triangular, trapezoidal or polygonal shapes, or a mixture of such shapes. The n-side of the LED structure, separated from the substrate, goes through a polishing process to remove the low quality nucleation and buffer layers to expose the n-type III-V nitride contact layer of structure 14. An n-type contact layer 15 with good optical transparency is then deposited onto the n-type III-V nitride semiconductor of structure 14 completing the structure.

EXAMPLES

Example 1

Figure 3:
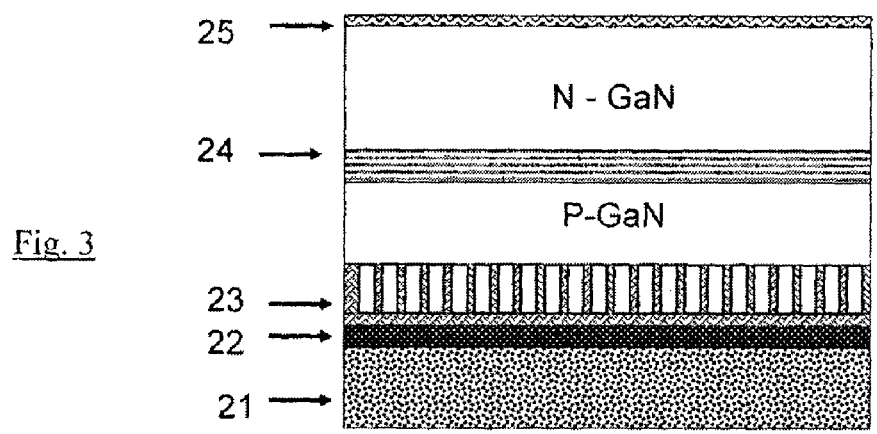
FIG. 3 shows an embodiment of an LED device with a patterned p-type surface with a metal composite substrate.

Although one embodiment of the invention is shown in FIGS. 1 and 2 above, it should be understood that this basic structure may be modified or combined with other improvements to further enhance the properties of the LEDs of the current invention. For example, FIG. 3 shows another exemplary structure of an embodiment of a vertical LED device with a foreign substrate removed. As above, the LED device includes an LED wafer or chip 24, a p-contact metal layer 23, a reflector layer 22, an electrolytically plated metal composite substrate 21 and an n-metal contact layer 25. A p-type bonding pad can be connected directly to the metal composite substrate 21, and an n-type bonding pad can be deposited on to the n-metal contact layer and connected by any suitable means. In the current embodiment to enhance light extraction, the p-type III-V nitride contact layer of wafer or chip 24 is roughened or patterned by various techniques. The roughened surface can be grown by in situ epitaxial growth with higher p-type doping. The roughened surface can also be fabricated by wet etching, electrochemical etching or photochemical etching. The patterned surface can be fabricated by dry or wet etching using masks produced by photolithography, holography, ink-jet printing, anodic porous alumina, metal annealing, interferometry, screen printing or nano-imprint.

Example 2

Figure 4:
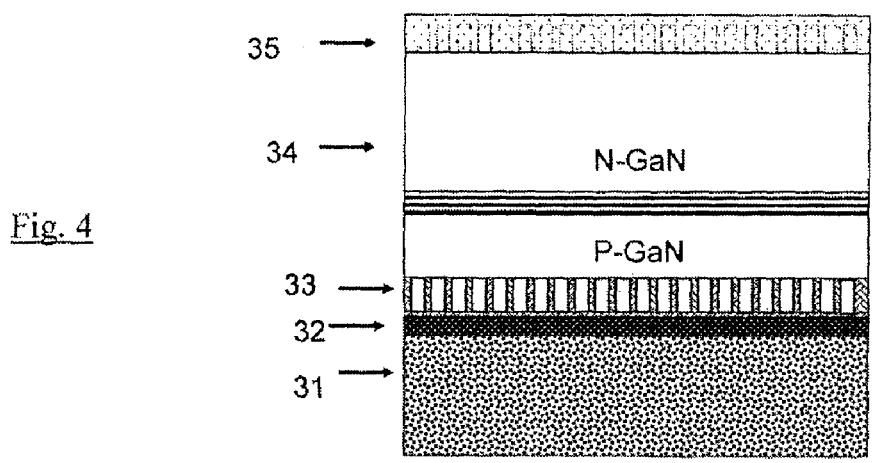
FIG. 4 shows an embodiment of a p-side down LED device with patterned n-type and p-type surfaces with a metal composite substrate.

FIG. 4 shows another exemplary structure of an embodiment of a vertical LED device with a foreign substrate removed. Again, as in the first embodiment of the invention, the LED device includes an LED wafer or chip 34, a p-contact metal layer 33, a reflector layer 32, an electrolytically plated metal composite substrate 31 and an n-metal contact layer 35. A p-type bonding pad can be connected directly to the metal composite substrate 31, and an n-type bonding pad can be deposited on to the n-metal contact layer and connected by any suitable means. In this embodiment to enhance light extraction, both the p-type and n-type III-V nitride contact layers of wafer or chip 34 are roughened or patterned by various techniques. The roughened surface can be grown by in situ epitaxial growth with higher p-type doping. The roughened surface of the p- and n-type III-V nitrides can also be fabricated by wet etching, electrochemical etching or photochemical etching. The patterned surface can be fabricated by dry or wet etching using masks produced by photolithography, holography, ink-jet printing, anodic porous alumina, metal annealing, interferometry, screen printing, or nano-imprint.

Example 3

Figure 5:
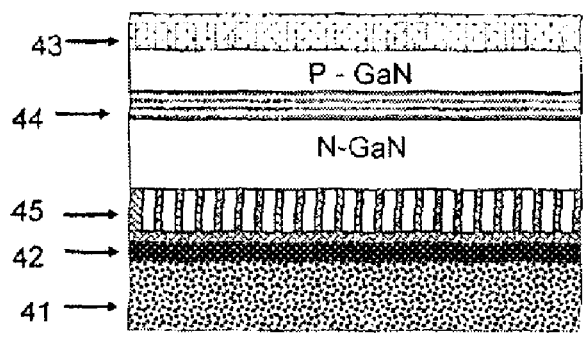
FIG. 5 shows an embodiment of an n-side down LED device with patterned n-type and p-type surfaces with a metal composite substrate.

FIG. 5 shows another exemplary structure of an embodiment of an n-side down vertical LED device with a foreign substrate removed. In this embodiment, the LED device includes an LED wafer or chip 44, a transparent p-contact metal layer 43, an n-metal contact layer 45, a reflector layer 42 and an electrolytically plated metal composite substrate 41. An n-type bonding pad can be connected directly to the metal composite substrate 41 and a p-type bonding pad can be deposited on to the p-metal contact layer and connected by any suitable means. Again, to enhance light extraction, both the n-type and p-type III-V nitride contact layers of wafer or chip 44 may be roughened or patterned by various techniques. The p-type roughened surface can be grown by in situ epitaxial growth with higher p-type doping. The roughened surface of the p- and n-type III-V nitrides can also be fabricated by wet etching, electrochemical etching or photochemical etching. The patterned surface can be fabricated by dry or wet etching using masks produced by photolithography, holography, ink-jet printing, anodic porous alumina, metal annealing, interferometry, screen printing or nano-imprint.

Example 4

Figure 6:
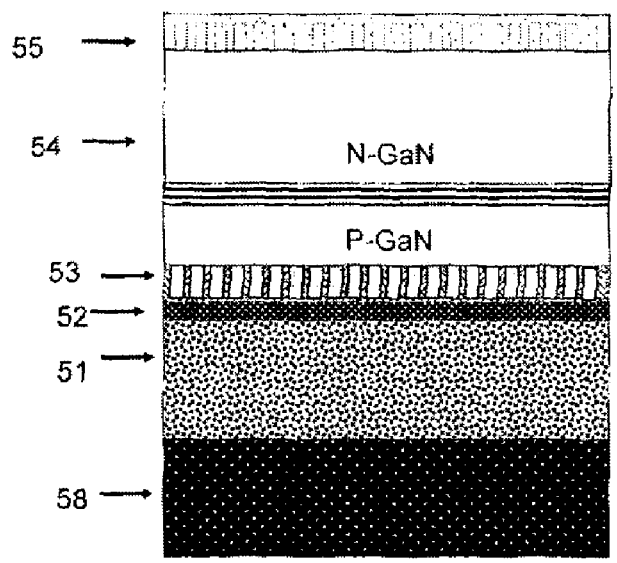
FIG. 6 shows an embodiment of a p-side down LED device with patterned n-type and p-type surfaces with a metal composite and a metal alloy substrate.

FIG. 6 shows an exemplary structure of an embodiment of a p-side down vertical LED device with a foreign substrate removed. As in the first exemplary embodiment, the LED device includes an LED wafer or chip 54, p-contact metal Layer 53, a reflector Layer 52, an electrolytically plated metal composite substrate 51 and an n-metal contact layer 55. However, in this embodiment an extra metal or metal alloy heat sink 58 is electrolessly or electrolytically plated on to the metal composite 51 to further enhance heat dissipation. A p-type bonding pad can be connected directly to the metal or metal alloy substrate 58, and an n-type bonding pad can be deposited on to the n-metal contact layer and connected by any suitable means. To enhance light extraction, both the p-type and n-type III-V nitride contact layers may be roughened or patterned by various techniques. The roughened surface can be grown by in situ epitaxial growth with higher p-type doping. The roughened surface of the p- and n-type III-V nitrides can also be fabricated by wet etching, electrochemical etching or photochemical etching. The patterned surface can be fabricated by dry or wet etching using masks produced by photolithography, holography, ink-jet printing, anodic porous alumina, metal annealing, interferometry, screen printing or nano-imprint.

Example 5

Figure 7:
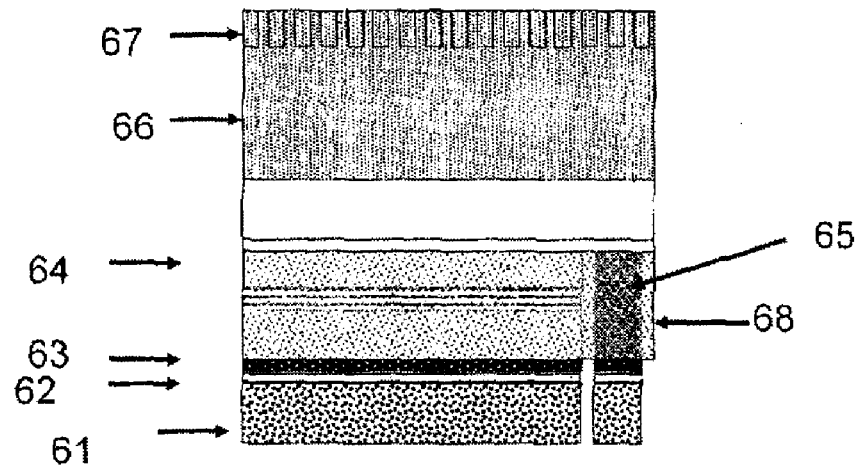
FIG. 7 shows an embodiment of a coplanar p-side and n-side down LED device with an original transparent wafer substrate attached and patterned.

FIG. 7 shows an exemplary structure of an embodiment of a coplanar p-side and n-side down LED device in accordance with the current invention, with the original wafer substrate attached and patterned. In this embodiment the LED device includes an LED chip 64 grown on a foreign substrate 66, a p-contact metal layer 63, a reflector layer 62, a plated metal composite substrate 61 and an n-metal contact layer 65. In addition, the LED of the embodiment includes an extra passivation layer 68 made of insulating dielectric material used to define the boundary for electroless or electrolytic plating of the metal composite substrate 61. Both p-type and n-type bonding pads can be connected directly to the two parts of the metal composite substrate 61. To enhance light extraction, the original substrate 66 may be roughened or patterned by various techniques. The randomly roughened surface can be fabricated by dry etching, wet etching, electrochemical etching or photochemical etching. The patterned surface can be fabricated by dry or wet etching using masks produced by photolithography, holography, ink-jet printing, anodic porous alumina, metal annealing, interferometry, screen printing or nano-imprint.

Example 6

Figure 8:
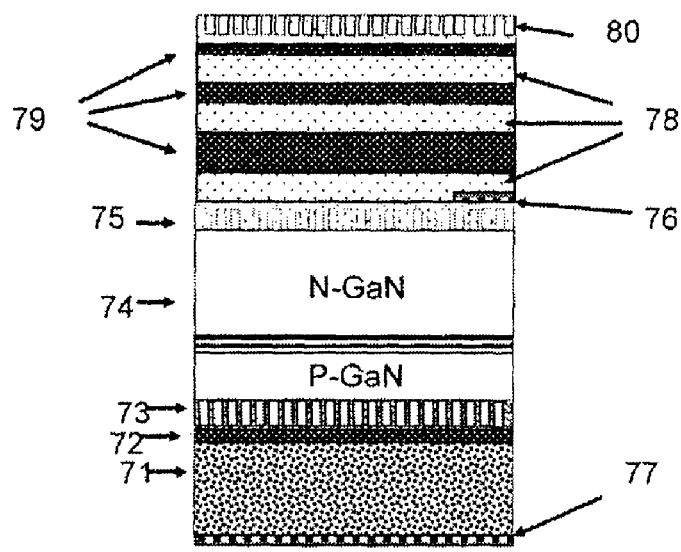
FIG. 8 shows an embodiment of a white p-side down LED device with phosphor layers attached to the top of a patterned n-side with a metal composite substrate.

FIG. 8 shows an exemplary structure of an embodiment of a p-side down white LED device further including a phosphor attached to the top of the patterned n-side. The vertical white LED device includes an LED wafer or chip 74, a p-contact metal layer 73, an n-metal contact layer 75, a reflector layer 72, and an electrolytically plated metal composite substrate 71. A p-type bonding pad 77 can be connected directly to the metal composite substrate 71 and an n-type bonding pad 76 can be deposited on to the n-metal contact layer and connected by any suitable means. To enhance light extraction, both the n-type and p-type III-V nitride contact layers of wafer or chip 74 are roughened or patterned by various techniques. The p-type roughened surface can be grown by in situ epitaxial growth with higher p-type doping. The roughened surface of the p- and n-type III-V nitrides can also be fabricated by wet etching, electrochemical etching, or photochemical etching. The patterned surface can be fabricated by dry and wet etching using masks produced by photolithography, holography, ink-jet printing, anodic porous alumina, metal annealing, interferometry, screen printing or nano-imprint.

The phosphor in the current embodiment is made of transparent polymer layers 78 and 80 and phosphor layers 79. The top polymer layer 80 can be patterned to further enhance and manipulate the light extraction efficiency and the direction of the light output. The polymer layers 78 and 80 can consist of single or multiple types of polymers. One example is to use hard polymers such as PMMA (polymethyl methacrylate), PC (polycarbonate) or an epoxy as the top few layers, but using silicone as the layer material between the top n-contact layer 75 and the phosphor layers 79. The phosphor can be directly deposited on to the LED device using spin coating, screen printing, plasma spraying or electrostatic coating. In the case of spin coating and screen printing, the phosphor material can be dispersed into a media containing solvents, polymers, additives, and curing agents. The phosphor can also be pre-fabricated to form a discrete component and then attached to the LED device using adhesive. The phosphor may comprise different numbers of layers. The phosphor layers 79 are formed in such a manner that the layers get thinner from the bottom to the top; and/or the layers consist of the same type of phosphors or the layers consist of different types of phosphors with the bottom layers emitting light with an average wavelength shorter than those on the top; and/or the layers are patterned to give a uniform light distribution. The n-contact layer 75 may be patterned in such a manner that the emitted light can be directed in a narrower angle distribution and much more collimated.

Example 7

Figure 9:
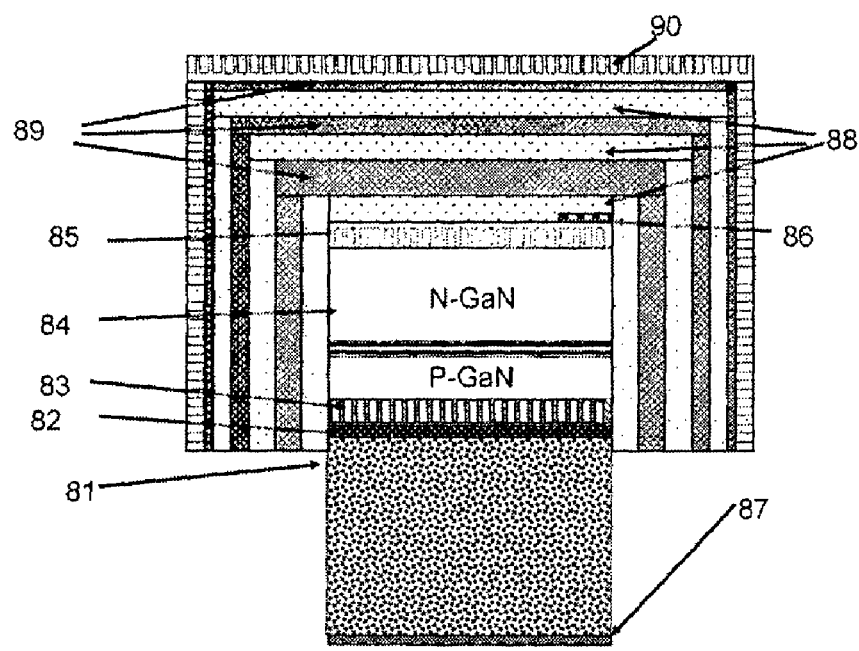
FIG. 9 shows an embodiment of a white p-side down LED device mounted into a package with a discrete phosphor conversion device attached to the whole LED chip with a metal composite substrate.

FIG. 9 shows an embodiment similar to Example 6, except that the phosphor is fabricated to form a cap to cover the full size of the LED device. The vertical white LED device includes an LED wafer or chip 84, a p-contact metal layer 83, an n-metal contact layer 85, a reflector layer 82 and an electrolytically plated metal composite substrate 81. A p-type bonding pad 87 can be connected directly to the metal composite substrate 81 and an n-type bonding pad 86 can be deposited on to the n-metal contact layer and connected by any suitable means. To enhance light extraction, both the n-type and p-type III-V nitride contact layers of wafer or chip 84 are roughened or patterned by various techniques. The p-type roughened surface can be grown by in situ epitaxial growth with higher p-type doping. The roughened surface of the p- and n-type III-V nitrides can also be fabricated by wet etching, electrochemical etching or photochemical etching. The patterned surface can be fabricated by dry or wet etching using masks produced by photolithography, holography, ink-jet printing, anodic porous alumina, metal annealing, interferometry, screen printing or nano-imprint.

The phosphor as before is made of transparent polymer layers 88 and 90 and phosphor layers 89. The top polymer layer 90 can be patterned to further enhance and manipulate the light extraction efficiency and the direction of the light output. The phosphor is pre-fabricated to form a discrete component, then attached to the LED device using adhesive. The phosphor may comprise different numbers of layers. The phosphor layers 79 are formed in such a manner: the layers get thinner from the bottom to the top; and/or the layers consist of the same type phosphors or the layers consist of different types of phosphors with the bottom layers emitting light with an average wavelength shorter than those on the top; and/or the layers are patterned to give uniform light distribution. The n-contact layer 85 may be patterned in such a manner that the emitted light can be directed in a narrower angle distribution and much more collimated.

Example 8

Figure 10:
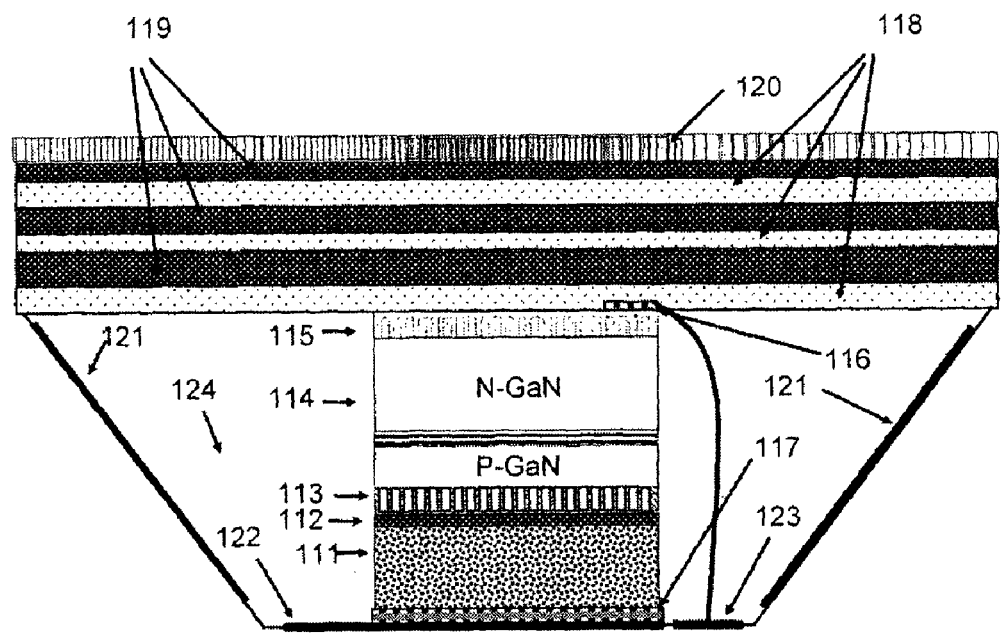
FIG. 10 shows an embodiment of a white p-side down LED device mounted into a package with a discrete phosphor conversion device attached to the top of a patterned n-side with a metal composite substrate.

FIG. 10 shows an embodiment of a p-side down white LED device that includes a discrete phosphor (118, 119, 120) mounted on the LED packaging. The vertical white LED device includes an LED chip 114, a p-contact metal layer 113, an n-metal contact layer 115, a reflector layer 112 and an electrolytically plated metal composite substrate 111. A p-type bonding pad 117 can be connected directly to the metal composite substrate 111, and an n-type bonding pad 116 can be deposited on to the n-metal contact layer and connected by any suitable means to the package. To enhance light extraction, both the n-type and p-type III-V nitride contact layers are roughened or patterned by various techniques. The p-type roughened surface can be grown by in situ epitaxial growth with higher p-type doping. The roughened surface of the p- and n-type III-V nitrides can also be fabricated by wet etching, electrochemical etching, or photochemical etching. The patterned surface can be fabricated by dry or wet etching using masks produced by photolithography, holography, ink-jet printing, anodic porous alumina, metal annealing, interferometry, screen printing or nano-imprint.

The phosphor arrangement is similar to that of Example 7, except that it is fabricated into a discrete device to be mounted on top of the LED package. The full LED device is mounted into a package with the sidewall coated with reflector materials 121 such as Ag, Al or dielectric mirror coatings. The bottom of the package is deposited with Au or other highly conductive metal or metal alloys in two areas 122 and 123, which are electrically isolated from each other. A p-side bonding pad 117 is bonded to the area 122, and n-side bonding pad 116 is wire-connected to the area 123. The inside of the LED package is filled with inert gas such as $N_2$, Ar etc, or a heat-conducting and electrically insulating material such as silicone oil or silicone oil mixed with nano- and micro-particles of high thermal conductivity. The thermally conductive materials can be CVD diamond, AlN, BN, SiC, etc.

Example 9

Figure 11:
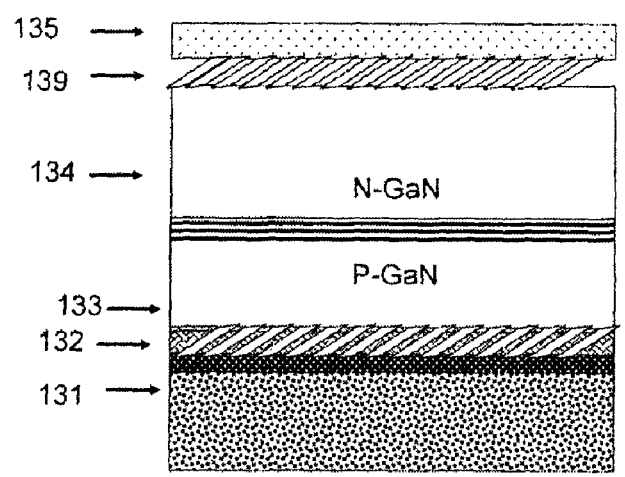
FIG. 11 shows an embodiment of a p-side down LED device with oblique etched patterned n-type and p-type surfaces with a metal composite substrate.

FIG. 11 shows an exemplary embodiment of a p-side down vertical LED device with a foreign substrate removed. The LED device includes an LED wafer or chip 134, a p-contact metal layer 133, a reflector layer 132, an electrolytically plated metal composite substrate 131 and an n-metal contact layer 135. A p-type bonding pad can be connected directly to the metal composite substrate 131, and an n-type bonding pad can be deposited on to the n-metal contact layer and connected by any suitable means. To enhance light extraction, both the p-type and n-type III-V nitride contact layers are roughened or patterned by various techniques. The roughened surface can be grown by in situ epitaxial growth with higher p-type doping. The roughened or patterned surface of the p- and n-type III-V nitrides is fabricated by oblique angle dry etching. The angle of etching can be varied between zero and ninety degrees. This oblique angle dry etching can be carried out in the etching chamber by tilting the sample the desired angle and orientation.

The fabricated patterned or roughened surface 139 may comprise nanostructures with the desired oblique angle, which in turn creates a layer of material of tunable refractive index lower than that of the original III-V nitrides. This in turn enhances the light extraction of the LED device. The patterned masks can be fabricated by photolithography, holography, ink-jet printing, anodic porous alumina, metal annealing, interferometry, screen printing or nano-imprint. The top transparent metal contact layer 135 may comprise ITO/Ni/Au, Ti/Al, TiN, ITO of different dopants, or ZnO.

SUMMARY

It will be apparent to those skilled in the art that a wide range of methods and process parameters can be accommodated within the scope of the invention, not just those explicitly described above. For example, the patterns on the n-type compound semiconductor contact layer can be photonic crystal, photonic quasicrystal, or gratings, hence the beam shape of the light output can be manipulated.

In another alternative embodiment the electroless or electrolytic plating used to form the metal composite substrate can be applied to the whole wafer. In such an embodiment, A photolithography process can be used to form the boundary of the chip on the p-side of the LED device using plasma enhance chemical vapour deposition (PECVD) silicon dioxide, the metal contact layer and reflector layer being then deposited and annealed. The buffer oxide removal process will then remove the silicon dioxide and lift off the metals deposited on top of this oxide. For the ease of separation of the chip a boundary of p-type compound semiconductor can then be exposed. Then an electroless or electrolytic plating process can be used to form the metal composite substrate. The original epitaxial growth substrate would then be removed.

It is also apparent that this invention can be easily extended to LEDs using different types of materials such as AlInGaP, AlInGaAs, ZnO, and other types of semiconductors.

Accordingly, while the invention has been described by way of examples and in terms of preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

The invention claimed is:

1. A method for fabricating a thermal expansion coefficient matching substrate for a high power light-emitting device using a metal composite substrate, wherein the metal composite substrate is fabricated by one of either electroless or electrolytic plating of a metal material containing suspended particulates on to a light emitting device.

2. The method according to claim 1, wherein the metal composite substrate comprises metal and thermally conductive nano- and micro-particulates.

3. The method according to claim 1, wherein the metal material is one of either a metal or a metal solution containing suspended particulates.

4. The method according to claim 3, wherein the metal is a metal alloy.

5. The method according to claim 1, wherein the metal composite substrate comprises a metal deposited by electroless plating or electroplating.

6. The according to claim 1, wherein the thermal expansion coefficient of the metal composite substrate is tuned to match the high power light-emitting device by varying the composition of the metal material used.

7. The method according to claim 2, wherein the thermal expansion coefficient of the metal composite substrate is tuned to match the high power light-emitting device by varying one characteristic of the composite of the substrate selected from the group consisting of the composition of the particulate material, the size distribution of the particulates, and the different volume percentages of the particulates.

8. The method according to claim 1, wherein the light-emitting device comprises one of either a vertical p-side down or n-side down device.

9. The method according to claim 1, wherein the light-emitting device comprises a phosphor device to convert light output from the device to a white light.

10. The method according to claim 9, wherein the phosphor device is in the form of multiple layers comprising alternating polymer layers and phosphor layers.

11. The method according to claim 9, wherein the phosphor device is applied directly to the light-emitting device.

12. The method according to claim 9, wherein the phosphor device is a discrete component.

13. The method according to claim 12, wherein the phosphor device comprises various optical patterns to enhance the uniformity of the light output of the light-emitting device.

14. The method according to claim 9, wherein the phosphor device comprises one of either a single material or multiple types of material of different emission wavelength.

15. The method according to claim 10, wherein the phosphor layer of the phosphor device closer to the light-emitting device is thicker.

16. The method according to claim 1, wherein the light-emitting device is mounted into a package containing an electrically insulating and a thermally conducting medium.

17. The method according to claim 16, wherein the medium comprises one of either an electrically insulating and thermally conducting liquid or high thermal conductivity nano- and micro-particles.

18. A high power light-emitting device having a metal composite substrate which comprises a high thermal conductivity and thermal expansion coefficient matching substrate, wherein the substrate includes a metal material containing suspended particulates, the metal material having been electroless or electrolytically plated on to the light emitting device.

* * * * *